United States Patent
Lee et al.

(10) Patent No.: US 7,782,097 B2
(45) Date of Patent: Aug. 24, 2010

(54) SOURCE DRIVER AND POWER DOWN DETECTOR THEREOF

(75) Inventors: Chuan-Che Lee, Sinshih Township, Tainan County (TW); Tsung-Yu Wu, Sinshih Township, Tainan County (TW); Yu-Jui Chang, Sinshih Township, Tainan County (TW); Kuan-Sheng Huang, Dashu Township, Kaohsiung County (TW)

(73) Assignee: Himax Technologies Limited (TW)

( * ) Notice: Subject to any disclaimer, the term of this patent is extended or adjusted under 35 U.S.C. 154(b) by 207 days.

(21) Appl. No.: 12/098,748

(22) Filed: Apr. 7, 2008
(Under 37 CFR 1.47)

(65) Prior Publication Data

US 2009/0153220 A1    Jun. 18, 2009

(30) Foreign Application Priority Data

Dec. 14, 2007    (TW) .............................. 96148004 A

(51) Int. Cl.
 *H03B 1/00*    (2006.01)
(52) U.S. Cl. ...................................... 327/108; 327/143
(58) Field of Classification Search .................. 327/77, 327/143, 108, 427, 544
 See application file for complete search history.

(56) References Cited

U.S. PATENT DOCUMENTS

2009/0058194 A1*    3/2009    Lee et al. ..................... 307/130
2009/0066378 A1*    3/2009    Lee et al. ..................... 327/143

\* cited by examiner

*Primary Examiner*—Long Nguyen
(74) *Attorney, Agent, or Firm*—Hayes Soloway P.C.

(57) ABSTRACT

The present invention discloses a source driver powered by a power supply comprising at least one channel, at least one output pad coupled to the channel, at least one switch connected between the output pad and a predetermined voltage, and a power down detector for detecting whether a first supply voltage from the power supply is insufficient and generating a reset signal to turn on the switch when the first supply voltage from the power supply is insufficient.

7 Claims, 4 Drawing Sheets

SOURCE DRIVER AND POWER DOWN DETECTOR THEREOF

RELATED APPLICATIONS

This application claims priority to Taiwan Application Serial Number 96148004, filed Dec. 14, 2007, which is herein incorporated by reference.

FIELD OF THE INVENTION

This invention relates to a power down detector for use in a source driver, and more particularly, to a source driver that can prevent an abnormal image from appearing on a display when a power supply supplying power to the source driver is down.

BACKGROUND OF THE INVENTION

Recently, liquid crystal displays (LCD) have been widely applied in electrical products due to the rapid progress of optical technology and semiconductor technology. Moreover, with advantages of high image quality, compact size, light weight, low driving voltage and low power consumption, LCDs have been introduced into portable computers, personal digital assistants and color televisions, and have become the mainstream display apparatus.

FIG. 1 shows a diagram of part of a conventional source driver 100 of the LCD. The source driver 100 includes a plurality of channels. The data stored in buffers (BUF_HV, BUF_LV) of channels is inputted to a multiplexer (MUX) 102 and further sent to a display 104 via output pads (114, 116) to show corresponding images on the display 104. A transistor 106 is electrically connected between the outputs of the source driver to share the voltages on the outputs if needed.

However, when the power supply powering the source driver is being turned off, the power supplying to the source driver decreases and the buffers may malfunction owing to the power insufficient, which results in abnormal images, such as line defects or band mura, shown on the display.

SUMMARY OF THE INVENTION

Therefore, an aspect of the present invention is to provide a source driver with a power down detector in which abnormal images shown on the display during power on/off of a power supply can be restrained.

Another objective of the present invention is to provide a power down detector used for detecting whether or not the power supply is turning on/off and generating a reset signal when the power supply is turning on/off.

In order to achieve the aforementioned aspects, the present invention provides a source driver powered by a power supply comprising at least one channel, at least one output pad coupled to the channel, at least one switch connected between the output pad and a predetermined voltage, and a power down detector for detecting whether a first supply voltage from the power supply is insufficient and generating a reset signal to turn on the switch when the first supply voltage from the power supply is insufficient.

According to the embodiment of the present invention, the source driver further comprises at least one multiplexer and a controller. The multiplexer is connected between the channel and the output pad. The controller controls the multiplexer to disconnect the channel with the output pad based on the reset signal.

The power down detector comprises a first voltage divider for generating a first divided voltage based on the first supply voltage, and a first comparator for comparing the first divided voltage with a threshold voltage to determine whether the first supply voltage is insufficient. The power down detector further comprises a second voltage divider, a second comparator, and an OR gate. The second voltage divider generates a second divided voltage based on a second supply voltage from the power supply. The second comparator compares the second divided voltage with the threshold voltage to determine whether the second supply voltage is insufficient. The OR gate has two input nodes respectively connected to outputs of the first comparator and the second comparator for outputting the reset signal. The first supply voltage is a high voltage compared to the second supply voltage, the first comparator is a high-voltage element and the second comparator is a low-voltage element. The power down detector further comprises a level shifter connected between the second comparator and the OR gate. The power down detector further detects whether a second supply voltage from the power supply is insufficient and generates the reset signal to turn on the switch when the second supply voltage from the power supply is insufficient.

To achieve the aforementioned aspects, the present invention provides a power down detector used in a source driver for detecting whether a first supply voltage from a power supply is insufficient. Output pads of the source driver are connected to a predetermined voltage via a switch. The power down detector comprises a first voltage divider for generating a first divided voltage based on the first supply voltage, and a first comparator for comparing the first divided voltage with the threshold voltage, and when the first supply voltage from a power supply is insufficient, outputting a reset signal for turning on the switch.

According to the embodiment of the present invention, the power down detector further comprises a second voltage divider, a second comparator, and an OR gate. The second voltage divider generates a second divided voltage based on a second supply voltage from the power supply. The second comparator compares the second divided voltage with the threshold voltage. The OR gate has two input nodes respectively connected to outputs of the first comparator and the second comparator for outputting the reset signal. The first voltage divider and the second voltage divider each comprises a plurality of resistors connected in series. The OR gate comprises a NOR gate and an inverter connected in series. The first supply voltage is a high voltage compared to the second supply voltage, the first comparator is a high-voltage element and the second comparator is a low-voltage element. The power down detector further comprises a level shifter connected between the second comparator and the OR gate. The power down detector further detects whether a second supply voltage from the power supply is insufficient and generates the reset signal when the second supply voltage from the power supply is insufficient.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
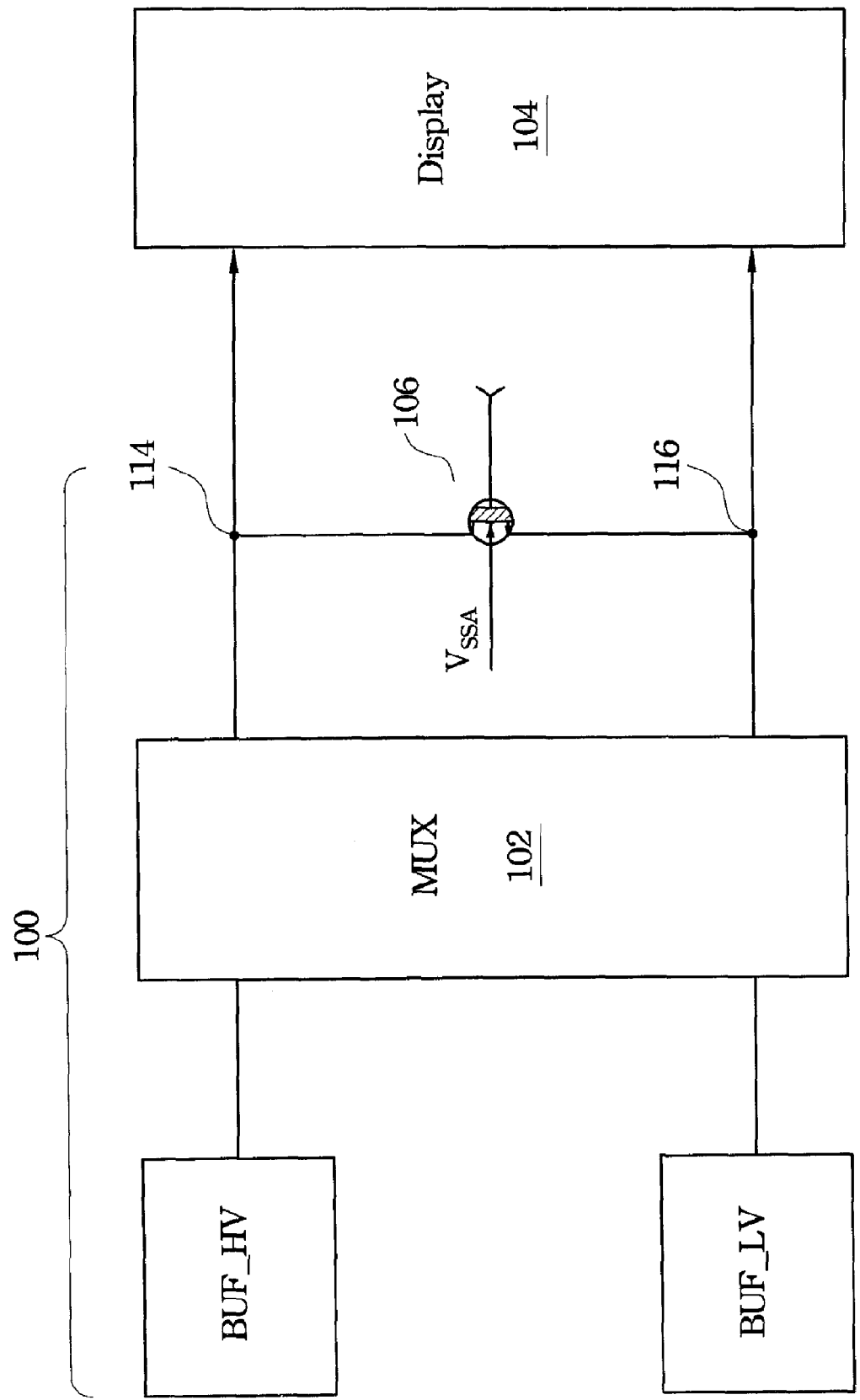
FIG. 1 shows a diagram of part of a conventional source driver of the LCD.
Figure 2:
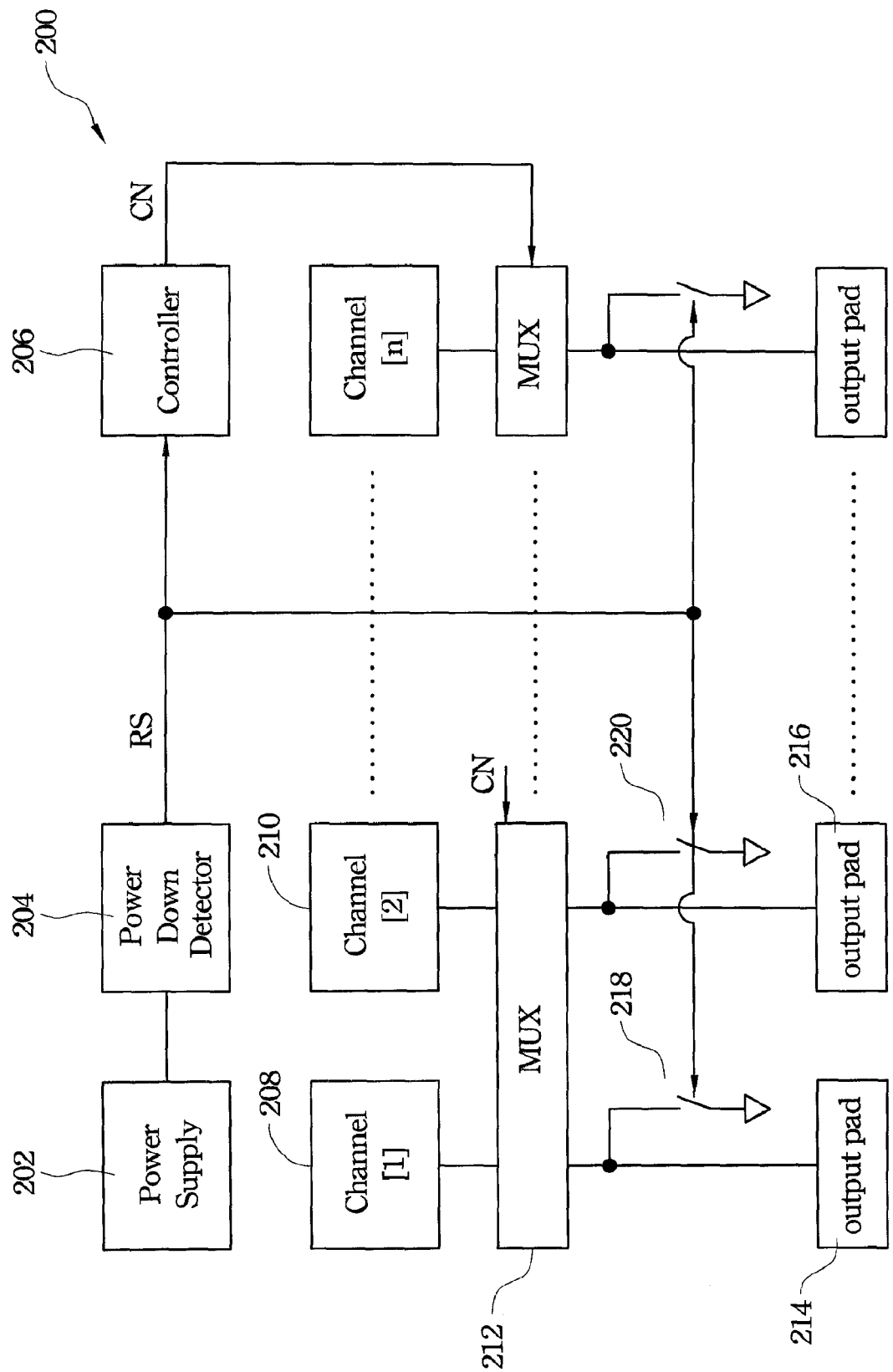
FIG. 2 shows a diagram of a source driver according to a preferred embodiment of the present invention.
Figure 3:
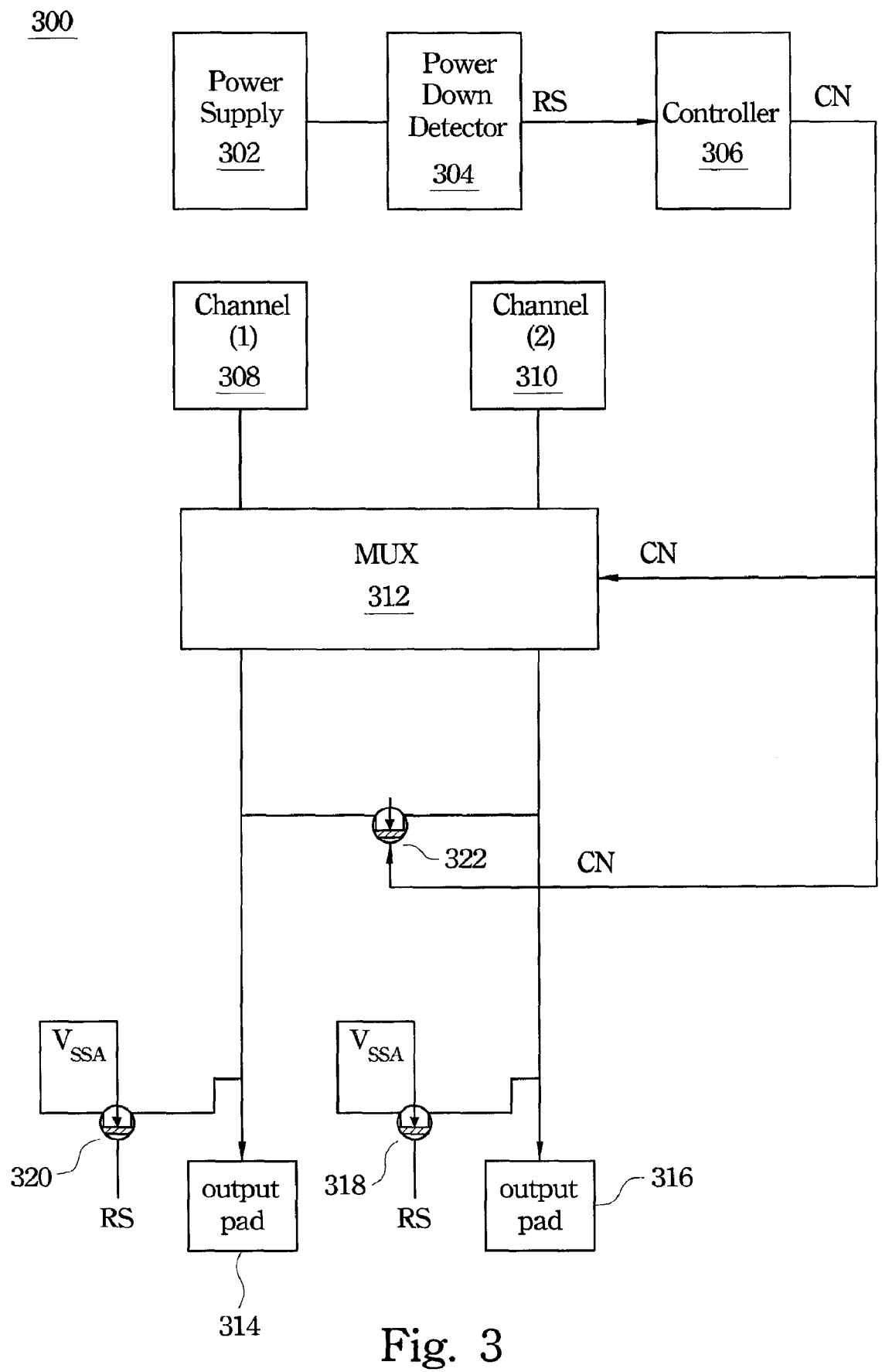
FIG. 3 shows a diagram of part of another source driver according to the preferred embodiment of the present invention.
Figure 4:
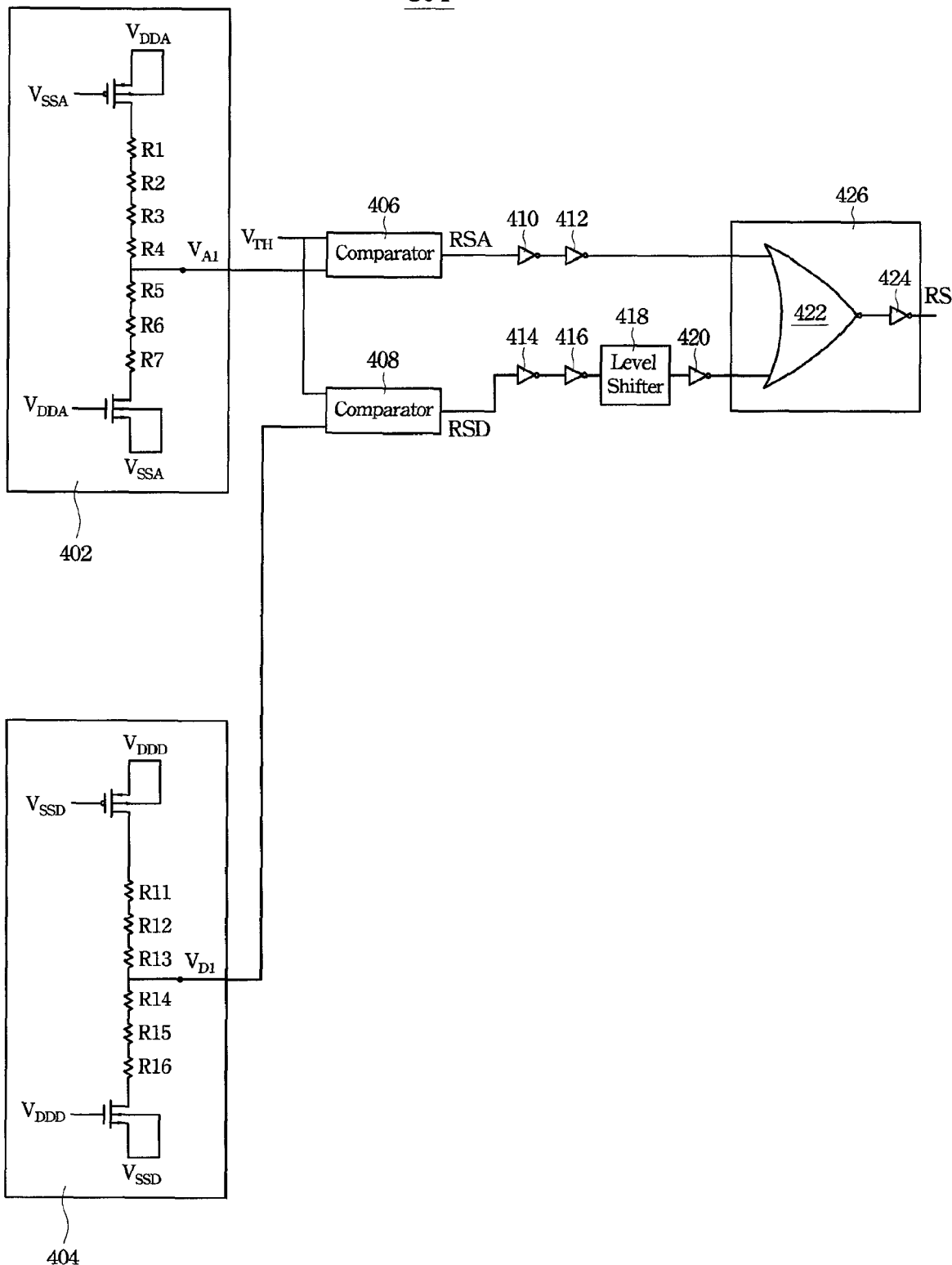
FIG. 4 shows a diagram of the power down detector according to the preferred embodiment of the present invention.

In order to make the illustration of the present invention more explicit and complete, the following description is stated with reference to FIGS. 2 through 4.

FIG. 2 shows a diagram of a source driver according to a preferred embodiment of the present invention. The source driver 200 in FIG. 2 is powered by a power supply 202, and the source driver comprises at least one channel (channel 208, channel 210 . . . ), at least one output pad (output pad 214, output pad 216 . . . ) coupled to the channel, at least one multiplexer (MUX) 212 connected between the channels and the output pads, at least one switch (switch 218, switch 220 . . . ) connected between the output pad and a predetermined voltage, a power down detector 204 connected to the power supply 202, and a controller 206 connected to the power down detector 204. The power supply 202 may provide a first supply voltage which is at high level and a second supply voltage which is at low level.

The power down detector 204 determines whether or not power is turning on or off and generates a reset signal RS when the power is turning on or off. The determination of power on/off is made by detecting whether any one of the first supply voltage and the second supply voltage from the power supply 202 is in sufficient, that is, below certain thresholds. The reset signal RS turns on the switches (switch 218, switch 220 . . . ) so that the output pads (214, 216 . . . ) output the predetermined voltage to a display (not shown in the drawing). In the preferred embodiment of the present invention, the predetermined voltage is set to a common voltage, so the display shows a corresponding black image or a white image during power on/off of the power supply.

The reset signal RS is further sent to the controller 206. The controller 206 then generates a control signal CN in accordance with the reset signal RS and sends the control signal CN to the multiplexers to disconnect the channels with the output pads so that the possibly malfunctioned buffers in the channels would not transmit abnormal data to the output pads when the power supply 202 powering the source driver is being turned on/off.

FIG. 3 shows a diagram of part of another source driver according to the preferred embodiment of the present invention. The source driver 300 in FIG. 3 is powered by a power supply 302, and the source driver comprises channels 308 and 310, a multiplexer (MUX) 312, output pads 314 and 316, switches 318, 320, and 322, a power down detector 304 connected to the power supply 302, and a controller 306 connected to the power down detector 304. The output pads 314 and 316 are coupled to the channels 308 and 310 via the multiplexer 312. The switch 322 is electrically connected between the output pads 314 and 316 of the source driver to share the voltages on the outputs if needed. The switches 318 and 320 each is connected between the corresponding output pad and a predetermined voltage, the voltage VSSA in this example, and controlled by the reset signal RS.

When the power supply 302 supplies power to the source driver 300 normally, the data in the channels is inputted to the multiplexer 312 and further sent to a display (not shown in the drawing) via the output pads 314 and 316 to show corresponding images on the display. When the power supply 302 is being turned on or off, the power sent to the source driver 300 becomes insufficient. The power down detector 304 generates a reset signal RS if the voltage sent from the power supply 302 is insufficient and sends the reset signal RS to the switch 318 and the switch 320 to turn them on. Thus, the predetermined voltage, such as the voltage VSSA, is sent to the output pads 314 and 316 and further to the display to show a corresponding black image or a white image.

Furthermore, the controller 306 generates a control signal CN based on the reset signal RS and sends the control signal CN to the multiplexer 312 to keep the multiplexers 312 in high impedance in order to disconnect the channels 308 and 310 with the output pads 314 and 316. Thus prevents the big current from flowing through the switch 318 and the switch 320 which results from the malfunctioned buffers in the channels when the switch 318 and the switch 320 are turned on. The switch 322 is controlled by the control signal CN to be on or off.

The following describes in detail the structure of the power down detector and the generation of the reset signal RS.

FIG. 4 shows a diagram of the power down detector according to the preferred embodiment of the present invention. The power down detector 304 in FIG. 4 comprises a first voltage divider 402, a second voltage divider 404, a first comparator 406, a second comparator 408, a first inverter 410, a second inverter 412, a third inverter 414, a fourth inverter 416, a level shifter 418, a fifth inverter 420 and an OR gate 426. The OR gate 426 comprises a NOR gate 422 and a sixth inverter 424 connected in series. The first voltage divider 402 includes series-connected resistors R1-R7, and the second voltage divider 404 includes series-connected resistors R11-R16.

The first voltage divider 402 generates a first divided voltage $V_{A1}$ based on the first supply voltage VDDA from the power supply, and the second voltage divider 404 generates a second divided voltage $V_{D1}$ based on the second supply voltage VDDD from the power supply. The first comparator 406 compares the first divided voltage $V_{A1}$ with the threshold voltage $V_{TH}$ and generates a first comparison signal RSA. The first comparison signal RSA is logic high if the first divided voltage $V_{A1}$ is smaller than the threshold voltage $V_{TH}$, inferring that the power supply is insufficient due to being turned on/off. The first comparison signal RSA is logic low if the first divided voltage $V_{A1}$ is greater than the threshold voltage $V_{TH}$, inferring that the power supply supplies power to the source driver normally.

Similarly, the second comparator 408 compares the second divided voltage $V_{D1}$ with the threshold voltage $V_{TH}$ and generates a second comparison signal RSD. The second comparison signal RSD is logic high if the second divided voltage $V_{D1}$ is smaller than the threshold voltage $V_{TH}$, inferring that the power supply is being turned on/off. The second comparison signal RSD is logic low if the second divided voltage $V_{D1}$ is greater than the threshold voltage $V_{TH}$, inferring that the power supply supplies power to the source driver normally. The first supply voltage VDDA is a high voltage compared to the second supply voltage VDDD, and the first comparator is a high-voltage element and the second comparator is a low-voltage element. The setting of the first divided voltage $V_{A1}$, the second divided voltage $V_{D1}$ and the threshold voltage $V_{TH}$ can be determined and changed by users.

The threshold voltage $V_{TH}$ is generated by a circuit that is not easily affected by the decreasing output of the power supply, such as a band-gap voltage generator.

The first comparison signal RSA is sent through the first inverter 410 and the second inverter 412 and to one input node of the OR gate 426. The second comparison signal RSD is sent through the third inverter 414 and the fourth inverter 416 and then to the level shifter 418 to shift the level of the second comparison signal RSD. The level-shifted second comparison signal RSD is further sent through the fifth inverter 420 and to the other input node of the OR gate 426. If the first comparison signal RSA and the second comparison signal RSD are both logic low, the OR gate 426 outputs a logic low signal inferring that the power supply supplies power to the source driver normally so that no reset signal is generated. Contrarily, if the first comparison signal RSA and/or the second comparison signal RSD are/is logic high, the OR gate 426 outputs a logic high signal inferring that the power supply is being turned on/off and the reset signal RS is generated. Then, the reset signal RS is sent to turn the switches 318 and 320 on so that the output pads 314 and 316 are connected to the predetermined voltage.

According to the aforementioned description, one advantage of the embodiment is that abnormal images shown on the display during power off of a power supply can be restrained.

According to the aforementioned description, yet another advantage of the embodiment is that a power down detector is used in the present invention to detect whether the power supply is being turned on/off and generates a reset signal when the power supply is being turned on/off.

As is understood by a person skilled in the art, the foregoing preferred embodiments of the present invention are strengths of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A source driver powered by a power supply, comprising:
    at least one channel;
    at least one output pad coupled to the channel;
    at least one switch connected between the output pad and a predetermined voltage; and
    a power down detector for detecting whether a first supply voltage from the power supply is insufficient and generating a reset signal to turn on the switch when the first supply voltage from the power supply is insufficient.

2. The source driver as claimed in claim 1, further comprising:
    at least one multiplexer connected between the channel and the output pad; and
    a controller for controlling the multiplexer to disconnect the channel with the output pad based on the reset signal.

3. The source driver as claimed in claim 1, wherein the power down detector comprises:
    a first voltage divider for generating a first divided voltage based on the first supply voltage; and
    a first comparator for comparing the first divided voltage with a threshold voltage to determine whether the first supply voltage is insufficient.

4. The source driver as claimed in claim 3, wherein the power down detector further comprises:
    a second voltage divider for generating a second divided voltage based on a second supply voltage from the power supply;
    a second comparator for comparing the second divided voltage with the threshold voltage to determine whether the second supply voltage is insufficient; and
    an OR gate having two input nodes respectively connected to outputs of the first comparator and the second comparator for outputting the reset signal.

5. The source driver as claimed in claim 4, wherein the first supply voltage is a high voltage compared to the second supply voltage, the first comparator is a high-voltage element and the second comparator is a low-voltage element.

6. The source driver as claimed in claim 5, wherein the power down detector further comprises a level shifter connected between the second comparator and the OR gate.

7. The source driver as claimed in claim 1, wherein the power down detector further detects whether a second supply voltage from the power supply is insufficient and generates the reset signal to turn on the switch when the second supply voltage from the power supply is insufficient.

* * * * *